United States Patent
Tanaka et al.

(10) Patent No.: US 8,189,640 B2
(45) Date of Patent: May 29, 2012

(54) LASER LIGHT EMITTING DEVICE

(75) Inventors: Taketoshi Tanaka, Kyoto (JP); Kuniyoshi Okamoto, Kyoto (JP); Hiroaki Ohta, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 12/451,604

(22) PCT Filed: May 21, 2008

(86) PCT No.: PCT/JP2008/059313
§ 371 (c)(1), (2), (4) Date: Apr. 8, 2010

(87) PCT Pub. No.: WO2008/143276
PCT Pub. Date: Nov. 27, 2008

(65) Prior Publication Data
US 2010/0189155 A1   Jul. 29, 2010

(30) Foreign Application Priority Data
May 21, 2007   (JP) ................................. 2007-134539

(51) Int. Cl.
*H01S 5/00* (2006.01)
(52) U.S. Cl. .................................................. 372/50.121
(58) Field of Classification Search ................. 372/50.1; 257/432; 438/22
See application file for complete search history.

(56) References Cited

U.S. PATENT DOCUMENTS

| | | | | |
|---|---|---|---|---|
| 4,803,695 A * | 2/1989 | Yamamoto et al. | ............. | 372/92 |
| 6,424,998 B2 * | 7/2002 | Hunter | ........................... | 709/207 |
| 6,430,605 B2 * | 8/2002 | Hunter | ........................... | 709/207 |
| 6,580,099 B2 * | 6/2003 | Nakamura et al. | ............. | 257/103 |
| 6,900,465 B2 * | 5/2005 | Nakamura et al. | ............... | 257/79 |
| 2006/0244003 A1 | 11/2006 | Ueda et al. | | |
| 2007/0023775 A1 | 2/2007 | Jang | | |
| 2007/0093073 A1 * | 4/2007 | Farrell et al. | ................... | 438/763 |

FOREIGN PATENT DOCUMENTS

| | | |
|---|---|---|
| JP | 2000-174398 A | 6/2000 |
| JP | 2003-298193 A | 10/2003 |
| JP | 2005-327826 A | 11/2005 |
| JP | 2006-066818 A | 3/2006 |
| JP | 2006-332611 A | 12/2006 |
| JP | 2007-043164 A | 2/2007 |

* cited by examiner

*Primary Examiner* — Jessica Stultz
*Assistant Examiner* — Tuan Nguyen
(74) *Attorney, Agent, or Firm* — Robert H. Berdo, Jr.

(57) ABSTRACT

Provided is a laser light emitting device that has light sources of multiple wavelengths including an oscillation wavelength in a green region and the like, and that can be miniaturized. A metal wiring 4 is formed on a supporting substrate 5. A green LD 1 and a red LD 2 are bonded to the metal wiring 4. Each of the green LD 1 and the red LD 2 is a laser diode element formed of a semiconductor having a layered structure. One of a positive electrode and a negative electrode of the element is bonded to the metal wiring 4, and the other electrode is connected to a lead wire 6 or a lead wire 7. The green LD 1 is formed of a GaN-based semiconductor laser diode having a nonpolar plane or a semipolar plane as a main surface for crystal growth. The red LD 2 is formed of an AlInGaP-based semiconductor laser diode.

13 Claims, 6 Drawing Sheets

FIG. 3
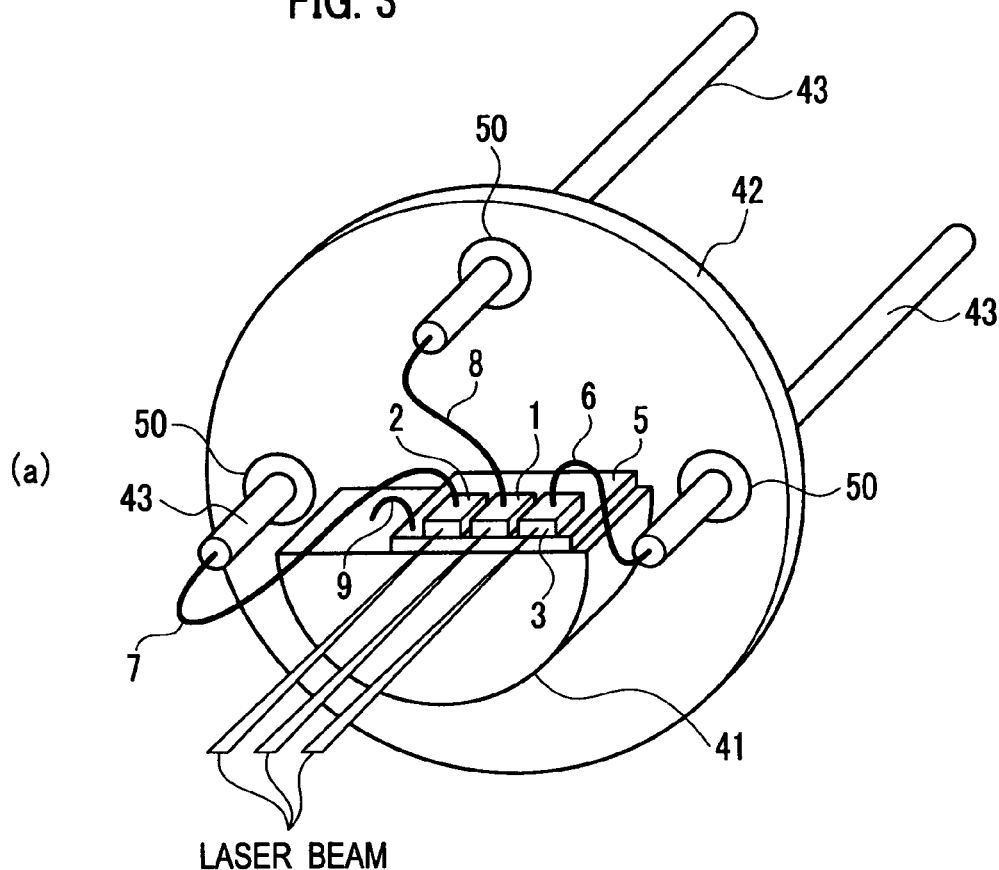
(a)
LASER BEAM
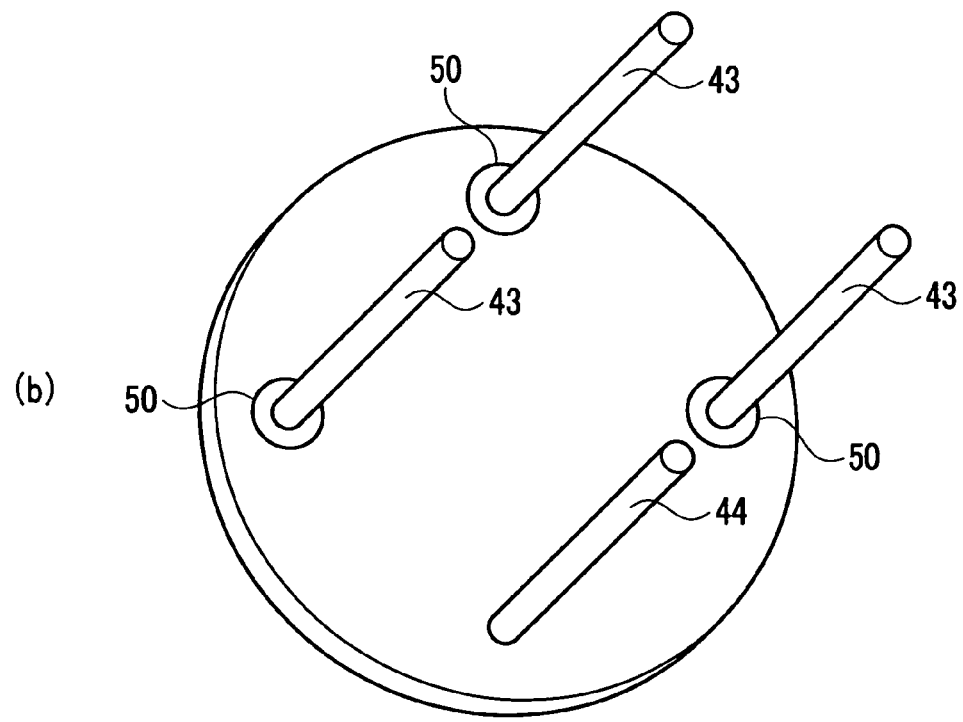
(b)

LASER LIGHT EMITTING DEVICE

TECHNICAL FIELD

The present invention relates to a device emitting laser beams of at least two oscillation wavelengths among wavelengths of blue, green, and red.

BACKGROUND ART

Monochromatic light sources of red (R), green (G), and blue (B) have been used for application of a variety of displays, the light sources generating a white light output having excellent color balance. For example, an SHG laser formed of a solid state laser, a nonlinear optical crystal, etc. is used for a RGB light source used for a transmissive liquid crystal display.

This SHG laser irradiates the solid state laser with excitation light emitted from a semiconductor laser, causes a fundamental wave oscillated by the solid state laser to enter the subsequent nonlinear optical crystal, thus obtains laser beams of oscillation wavelengths of RGB by using a second harmonic or the like extracted from the nonlinear optical crystal. In order to form the respective light sources of RGB, it is necessary to change a kind of the solid state laser and a kind of the nonlinear optical crystal for R, G, and B (for example, see Patent Document 1).

Patent document 1: Japanese Patent Application Publication No. 2006-66818

DISCLOSURE OF THE INVENTION

Problems to be Solved by the Invention

However, the above-mentioned SHG laser needs a lot of components, such as a semiconductor laser for excitation, a solid state laser, a nonlinear optical crystal, and a reflective mirror, etc. Inevitably, it is difficult to miniaturize the SHG laser as an RGB light source.

Meanwhile, an attempt to obtain a green laser beam directly from a semiconductor laser diode has been also made. A GaN based semiconductor laser diode has been manufactured by growing a group III nitride semiconductor on a gallium nitride (GaN) substrate having a c plane as a main surface by metal-organic vapor phase epitaxy (MOVPE). In the case of crystal growth on the c plane as the main surface, the wurtzite structure causes an epitaxial film grown on the c plane to have two inequivalent surfaces. For this reason, spontaneous polarization and a piezoelectric effect based on lattice strain cause a polarization electric field at the heterojunction interface, so that light emitting efficiency is reduced. This phenomenon becomes remarkable particularly at a wavelength longer than 500 nm.

For example, in order to generate an oscillation wavelength of a green region, an In composition ratio in an InGaN active layer (light emitting layer) must be increased. However, when the In composition ratio is increased, the above-mentioned polarization electric field also becomes larger. Accordingly, electrons and electron holes injected into the active layer are pulled away from each other, so that light emission transition probability is reduced, thereby causing a problem that and a light output becomes smaller.

The present invention has been made in order to solve the problems mentioned above. An object of the present invention is to provide a laser light emitting device that has light sources of multiple wavelengths including an oscillation wavelength of a green region or the like and can be miniaturized.

Means for Solving the Problems

To achieve the above object, an invention according to claim 1 is a laser light emitting device characterized by comprising at least a GaN-based semiconductor laser diode which has a nonpolar plane or a semipolar plane as a main surface for crystal growth and an AlInGaP-based semiconductor laser diode.

Additionally, an invention according to claim 2 is the laser light emitting device according to claim 1 characterized in that the GaN-based semiconductor laser diode has an oscillation wavelength of 512 nm to 552 nm in a green region.

In addition, an invention according to claim 3 is the laser light emitting device according to claim 1 characterized in that the AlInGaP-based semiconductor laser diode has an oscillation wavelength of 625 nm to 665 nm in a red region.

Further, an invention according to claim 4 is the laser light emitting device according to claim 1 characterized in that the GaN-based semiconductor laser diode is formed of a first GaN-based semiconductor laser diode and a second GaN-based semiconductor laser diode.

Furthermore, an invention according to claim 5 is the laser light emitting device according to claim 4 characterized in that the first GaN-based semiconductor laser diode has an oscillation wavelength of 440 nm to 480 nm in a blue region, and the second GaN-based semiconductor laser diode has an oscillation wavelength of 512 nm to 552 nm in a green region.

Still further, an invention according to claim 6 is the laser light emitting device according to any one of claims 1 to 5 characterized in that the GaN-based semiconductor laser diode and the AlInGaP-based semiconductor laser diode are disposed on a common support body.

Yet further, an invention according to claim 7 is the laser light emitting device according to claim 6 characterized in that the support body is made of AlN.

Moreover, an invention according to claim 8 is the laser light emitting device according to any one of claims 1 to 7 characterized in that either one of a positive electrode and a negative electrode in each of the semiconductor laser diodes is wired independently.

Also, an invention according to claim 9 is the laser light emitting device according to any one of claims 1 to 7 characterized in that either one of a positive electrode and a negative electrode in each of the semiconductor laser diodes is short-circuited.

Besides, an invention according to claim 10 is the laser light emitting device according to any one of claims 1 to 9 characterized in that the GaN-based semiconductor laser diode and the AlInGaP-based semiconductor laser diode are repeatedly arranged in an array.

Effect of the Invention

According to the present invention, a device emitting laser beams having oscillation wavelengths among multiple wavelengths is formed of at least a GaN based semiconductor laser diode having a nonpolar plane or a semipolar plane as a main surface for crystal growth, and an AlInGaP based semiconductor laser diode. Moreover, the laser light emitting device is formed of a semiconductor laser diode corresponding to each oscillation wavelength. Accordingly, the laser light emitting device can be miniaturized. Further, the GaN based semiconductor laser diode has a nonpolar plane or a semipolar plane as a main surface for crystal growth. Accordingly, the polarization electric field applied to the active layer is suppressed so that a green oscillation wavelength can be obtained.

BRIEF DESCRIPTION OF THE DRAWINGS

FIG. 3 is a drawing showing other cross-sectional structure of a second GaN based semiconductor element according to the present invention.

Figure 1:
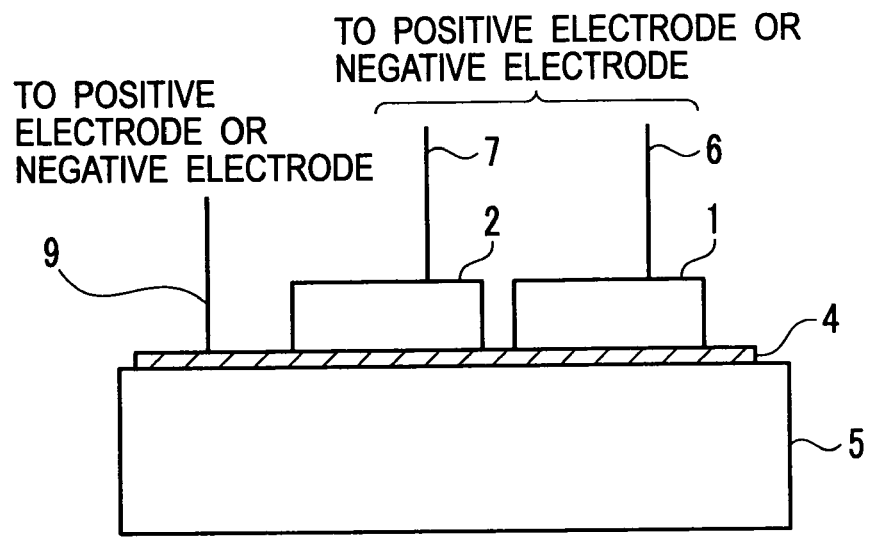
FIG. 1 is a drawing showing a structure of a first laser light emitting device according to the present invention.

EXPLANATION OF REFERENCE NUMERALS 1 green LD
2 red LD
3 blue LD
4 metal wiring
5 supporting substrate
6 lead wire
7 lead wire
8 lead wire
9 lead wire

BEST MODE FOR CARRYING OUT THE INVENTION

Figure 2:
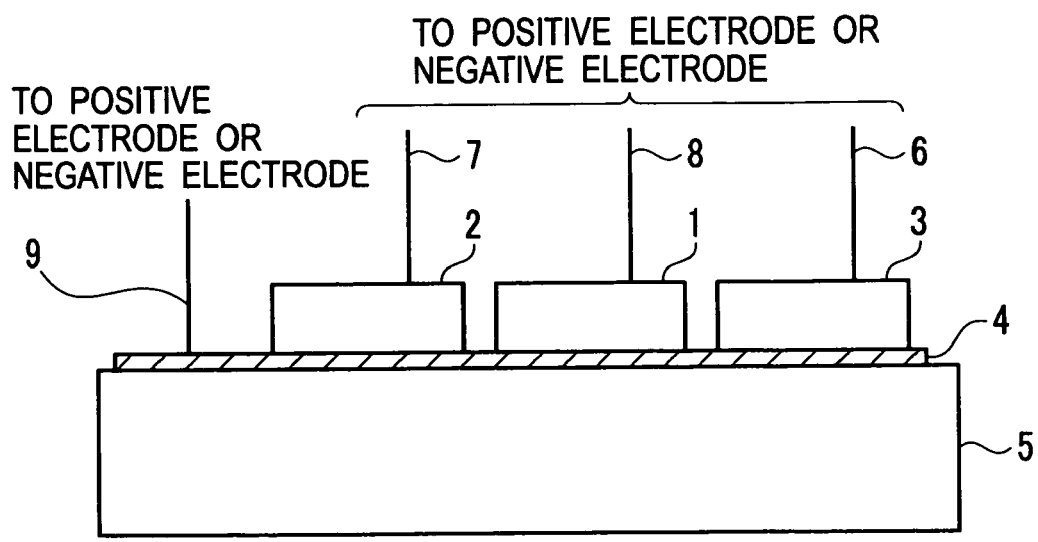
FIG. 2 is a drawing showing a structure of a second laser light emitting device according to the present invention.

Hereinafter, one embodiment of the present invention will be described with reference to the drawings. FIG. 1 shows a structure of a first laser light emitting device of the present invention, and FIG. 2 shows a structure of a second laser light emitting device.

In the first laser light emitting device, a metal wiring 4 is formed on a supporting substrate 5 as a support body, and a green LD 1 and a red LD 2 are bonded to the metal wiring 4. Here, LD designates a laser diode. The green LD 1 and the red LD 2 are each a laser diode element formed of a semiconductor having a layered structure. The element has one of a positive electrode (anode) and a negative electrode (cathode) bonded to the metal wiring 4, and the other electrode connected to a lead wire 6 or a lead wire 7.

For example, when the electrode of each laser diode element connected to the lead wire 6 or the lead wire 7 is a positive electrode, an end of the lead wire 6 or the lead wire 7 is wired to a positive electrode of a driving power source or the like, and an end of a lead wire 9 connected to the metal wiring 4 is wired to a negative electrode of a power supply or the like. When the electrode of each laser diode element connected to the lead wire 6 or the lead wire 7 is a negative electrode, an end of the lead wire 6 or the lead wire 7 is wired to negative electrode of the driving power source or the like, and an end of a lead wire 9 connected to the metal wiring 4 is wired to a positive electrode of the power supply or the like.

Here, the electrodes opposite to the electrodes connected to the lead wire 6 and to the lead wire 7 are short-circuited by the metal wiring 4.

Moreover, the green LD 1 is formed so as to have an oscillation wavelength in a green region of 532 nm±20 nm (512 nm to 552 nm), while the red LD 2 is formed so as to have an oscillation wavelength in a red region of 645 nm±20 nm (625 nm to 665 nm).

Figure 4:
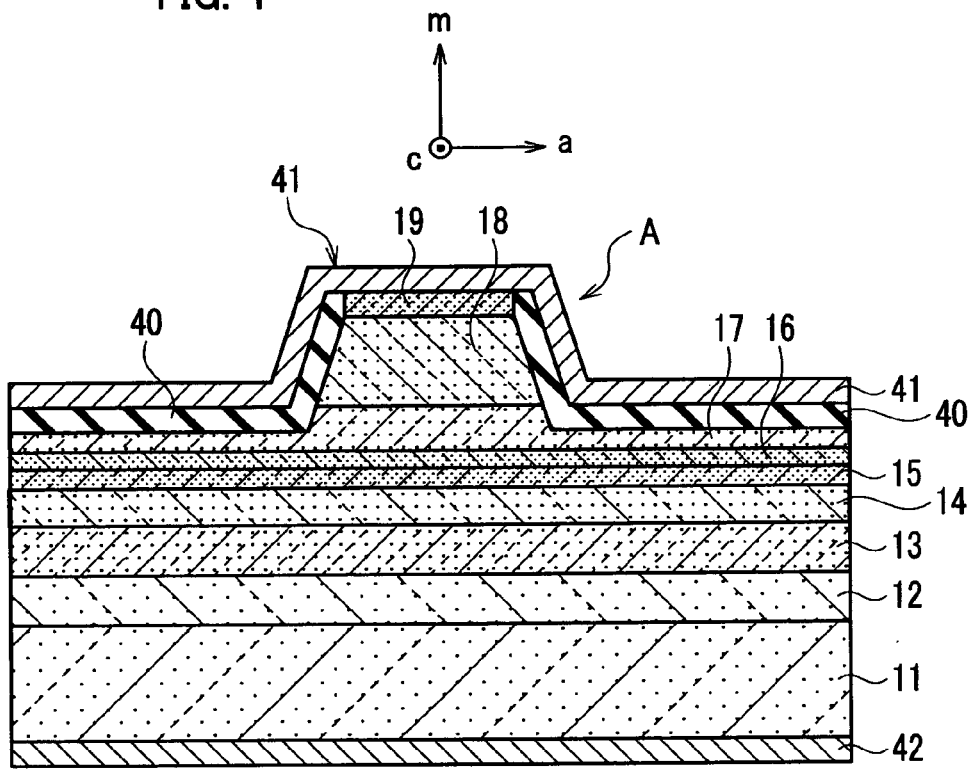
FIG. 4 is a drawing showing a cross-sectional structure of a GaN based semiconductor element.

FIG. 4 shows an example of a specific structure of the green LD 1. A III-V group GaN based semiconductor, which is a hexagonal compound semiconductor, is used for the green LD 1. The above-mentioned III-V group GaN based semiconductor is expressed with $Al_xGa_yIn_zN$ ($x+y+z=1$, $0 \leq x \leq 1$, $0 \leq y \leq 1$, $0 \leq z \leq 1$) of a quaternary mixed crystal.

An n type GaN contact layer 12 (for example, thickness of 2 μm), an n type AlGaN clad layer 13 (thickness of not more than 1.5 μm, for example, thickness of 1.0 μm), an n type GaN light guide layer 14 (for example, thickness of 0.1 μm), and an InGaN active layer (light emitting layer) 15 are formed in this order on the GaN single crystal substrate 11. Next, as a p type semiconductor layer, a p type AlGaN electron block layer 16 (for example, thickness of 20 nm), a p type GaN light guide layer 17 (for example, thickness of 0.1 μm), a p type AlGaN clad layer 18 (thickness of not more than 1.5 μm, for example, thickness of 0.4 μm), and a p type GaN contact layer 19 (for example, thickness of 0.05 μm) are deposited in this order on the active layer 15.

Here, the GaN single crystal substrate 11 has an m plane as a main surface. A GaN based semiconductor layer, which is a group III nitride semiconductor, is deposited by crystal growth on this main surface. Therefore, the m plane serves as the main surface for crystal growth for all the GaN based semiconductor layers from the GaN based semiconductor layer grown on the m plane of the GaN single crystal substrate 11 to the p type GaN contact layer 19 as the top layer.

Figure 8:
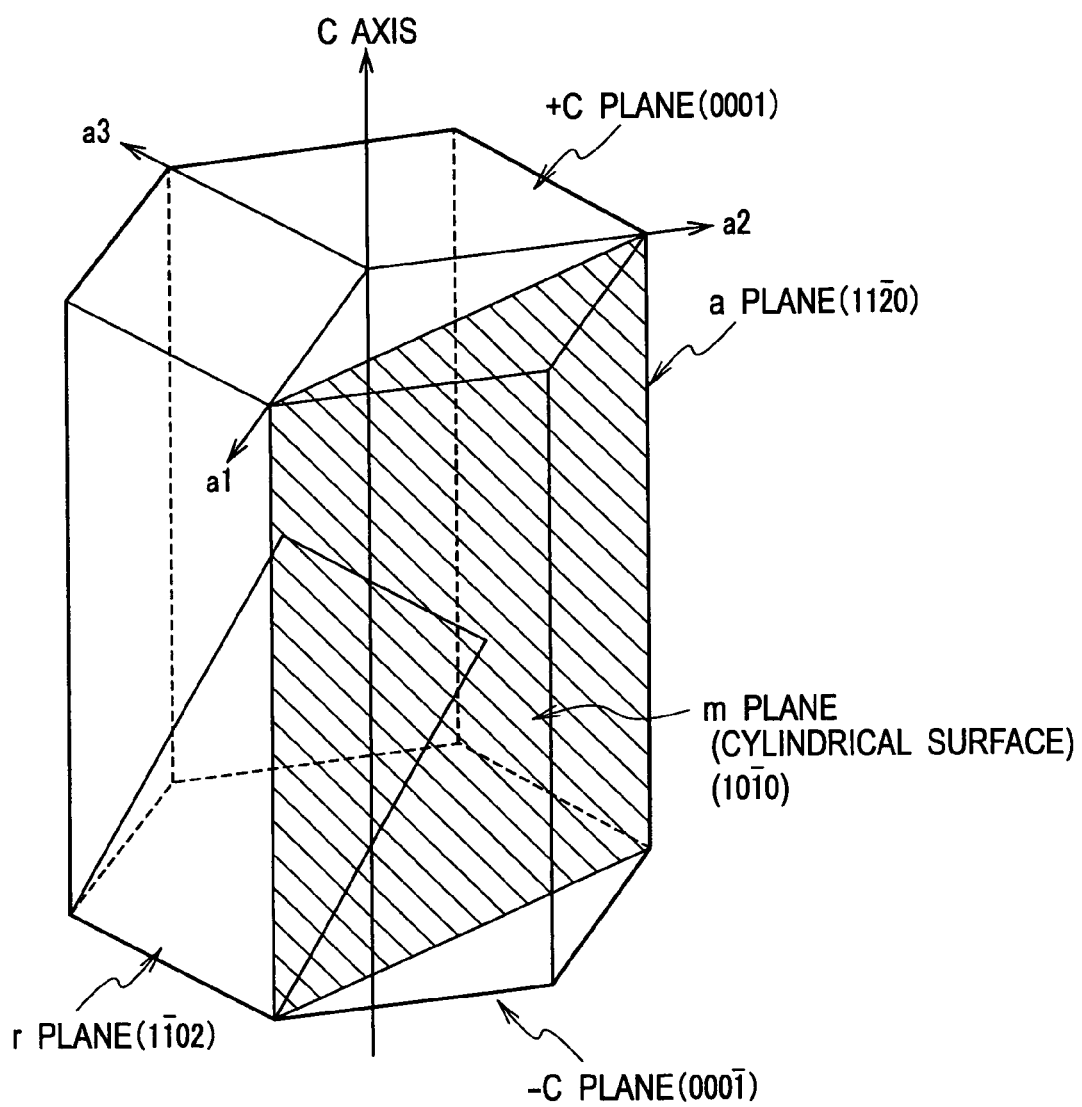
FIG. 8 is a unit cell drawing showing a plane orientation of a hexagonal system.

FIG. 8 is an illustration showing a unit cell of a crystalline structure of the GaN based semiconductor. The crystalline structure of the GaN based semiconductor can be approximated by a hexagonal system. A c plane (0001) is a plane (top surface of a hexagonal column) whose normal line is a c axis extending in an axis direction of the hexagonal column. In the GaN based semiconductor, a polarization direction extends along the c axis. For that reason, a +c axis side of the c plane and a −c axis side thereof shows different properties, and therefore, the c plane is referred to as a polar plane. Meanwhile, each side surface (cylindrical surface) of the hexagonal column is an m plane (10-10), and a plane intersecting a pair of ridges that are not adjacent to each other is an a plane (11-20) is. These are crystalline planes perpendicular to the c plane and intersect perpendicular to the polarization direction. Therefore, these are referred to as a plane without polarity, i.e., a nonpolar plane.

Since a main surface for crystal growth is the m plane of a nonpolar plane as mentioned above, neither an electric field due to spontaneous polarization nor a piezoelectric field based on lattice strain is generated at a heterojunction interface so that reduction in light emitting efficiency is prevented. Accordingly, even when the In composition ratio in the InGaN active layer 15 is increased in order to cause the oscillation wavelength of the green region, the semiconductor can be used as an excellent green light source without creating a strong polarization electric field. Other nonpolar planes (for example, an a plane) may be used, or semipolar planes, for example, (10-1-1), (10-1-3) (11-22), etc. may be used although those have a little influence from the polarization electric field.

The n type GaN contact layer 12 is a low resistance layer. The p type GaN contact layer 19 is a low resistance layer for making an ohmic contact with a p electrode 41. The n type GaN contact layer 12 is a semiconductor layer obtained by doping GaN with an n type dopant Si of $3 \times 10^{18}$ cm$^{-3}$, for example. Moreover, the p type GaN contact layer 19 is a semiconductor layer obtained by doping GaN with a p type dopant Mg of $3 \times 10^{19}$ cm$^{-3}$, for example.

The n type AlGaN clad layer 13 and the p type AlGaN clad layer 18 bring about a light confinement effect to confine light from the active layer 15 between the n type AlGaN clad layer 13 and the p type AlGaN clad layer 18. The n type AlGaN clad layer 13 is a semiconductor layer obtained by doping AlGaN with an n type dopant Si of $3 \times 10^{18}$ cm$^{-3}$. Moreover, the p type AlGaN clad layer 18 is a semiconductor layer obtained by doping AlGaN with a p type dopant Mg of $3 \times 10^{19}$ cm$^{-3}$, for example. The n type AlGaN clad layer 13 has a band gap wider than that of the n type GaN light guide layer 14, and the p type AlGaN clad layer 18 has a band gap wider than that of the p type GaN light guide layer 17. Thereby, the light can be excellently confined, and a semiconductor laser diode with a low threshold and high efficiency can be achieved.

The n type GaN light guide layer 14 and the p type GaN light guide layer 17 are semiconductor layers that bring about a carrier confinement effect to confine carriers (electrons and electron holes) in the active layer 15. Thereby, efficiency of recombination of the electrons with the electron holes in the active layer 15 is improved. The n type GaN light guide layer 14 is a semiconductor layer obtained by doping GaN with an n type dopant Si of $3'10^{18}$ cm$^{-3}$, for example. The p type GaN light guide layer 17 is a semiconductor layer obtained by doping GaN with a p type dopant Mg of $5 \times 10^{18}$ cm$^{-3}$, for example.

The p type AlGaN electron block layer 16 obtained by doping GaN with a p type dopant Mg of $5 \times 10^{18}$ cm$^{-3}$, for example, prevents the electrons flowing out of the active layer 15 and thus improves the efficiency of recombination of the electrons with the electron holes.

The active layer 15 has an MQW (multiple quantum well) structure (multiple quantum well structure) including InGaN, for example. The active layer 15 is a layer for amplifying generated light, the light generated by recombination of the electrons and the electron holes. Specifically, the active layer 15 is formed by repeatedly depositing an InGaN well layer (for example, thickness of 3 nm) and a GaN barrier layer (for example, thickness of 9 nm) alternately in approximately 2 to 7 cycles. In this case, the band gap becomes comparatively small when the InGaN well layer has In not less than 5% in the composition ratio, and the InGaN well layer forms a quantum well layer. On the other hand, the GaN barrier layer functions as a barrier layer having a comparatively large band gap.

An emission wavelength is adjusted so that the InGaN well layer has In in a higher composition ratio. Thereby, the oscillation wavelength of 512 nm to 552 nm in the green region is obtained. Desirably, the In composition of the InGaN well layer is around 20%, for example, and the InGaN well layer is around 30 Å. In the MQW structure, the number of quantum wells including In is preferably not more than 3.

The p type semiconductor laminated body from the p type AlGaN electron block layer 16 to the p type GaN contact layer 19 forms a ridge stripe A by removing a part of the p type semiconductor laminated body by mesa etching. More specifically, a part of each of the p type contact layer 19, the p type AlGaN clad layer 18, and the p type GaN light guide layer 17 is removed by etching to form the mesa ridge stripe A. This ridge stripe A is formed so as to extend in the c axis direction, as shown in FIG. 4.

A pair of end surfaces (parallel to the page space) formed of cleavages on both sides in a longitudinal direction (c axis direction) of the ridge stripe A are parallel to each other, and are perpendicular to the c axis. The end surfaces respectively form a c plane and a −c plane. A resonator is formed between these end surfaces. The light generated in the active layer 15 is amplified by induced emission while reciprocating between the end surfaces of the resonator. Then, a part of the amplified light is extracted from the end surface of the resonator outside the element as a laser beam.

An n electrode 42 is made of an Al metal, for example, and the p electrode 41 is made of an Al metal or a Pd/Au alloy, for example. The n electrode 42 and the p electrode 41 are in ohmic contact with the p type contact layer 19 and the GaN single crystal substrate 11, respectively. An insulating layer 40 that covers exposed surfaces of the p type GaN light guide layer 17 and the p type AlGaN clad layer 18 is provided so as to allow the p electrode 41 to come into contact with only the p type GaN contact layer 19, which is the top surface of the ridge stripe A (contact region having a stripe shape). This allows concentration of current on the ridge stripe A, thereby enabling efficient laser oscillation. The insulating layer 40 can be made of insulating materials having a refractive index larger than 1, for example, $SiO_2$ and $ZrO_2$.

Further, the top surface of the ridge stripe is the m plane, and the p electrode 41 is formed on this m plane. In addition, a rear surface of the GaN single crystal substrate 11 on which the n electrode 42 is formed is also the m plane. Since both of the p electrode 41 and the n electrode 42 are formed on the m planes in this manner, it is possible to attain reliable semiconductor laser diode which can sufficiently bear a higher output of the laser and operation at a higher temperature.

For producing the semiconductor laser diode in FIG. 4, first, the GaN single crystal substrate 11 having the m plane as a main surface can be produced by cutting out of a GaN single crystal having the c plane as a main surface. The m planes of the cut-out substrate are polished by chemical mechanical polishing treatment, for example. A directional error of the (0001) orientation and that of the (11-20) orientation are set to be not more than ±1° (preferably not more than ±0.3°). Thus, the GaN single crystal substrate 11 having the m plane as a main surface without crystal defects such as transposition or deposition defects is obtained. Only level differences at an atom level are generated on the surface of such a GaN single crystal substrate 11.

Then, each semiconductor layer is grown by metal-organic vapor phase epitaxy (MOVPE). When performing crystal growth, material gases used as raw materials of component elements for each semiconductor layer are fed in combination. When the respective semiconductor layers from the n type GaN contact layer 12 to the p type GaN contact layer 19 are grown on the GaN single crystal substrate 11, a V/III ratio is maintained at a high value of not less than 1000 (preferably not less than 3000) in the case of growth of each layer, the V/III ratio being a ratio of a molar fraction of a nitrogen material (ammonia) to a molar fraction of a gallium material (trimethylgallium) to be supplied. More specifically, preferably, an average value of the V/III ratio is not less than 1000 in each layer from the n type AlGaN clad layer 13 to the topmost p type contact layer 19. Thereby, in all the layers of the n type AlGaN clad layer 13, the active layer 15, and the p type AlGaN clad layer 18, an excellent crystal having fewer point defects can be obtained.

Figure 5:
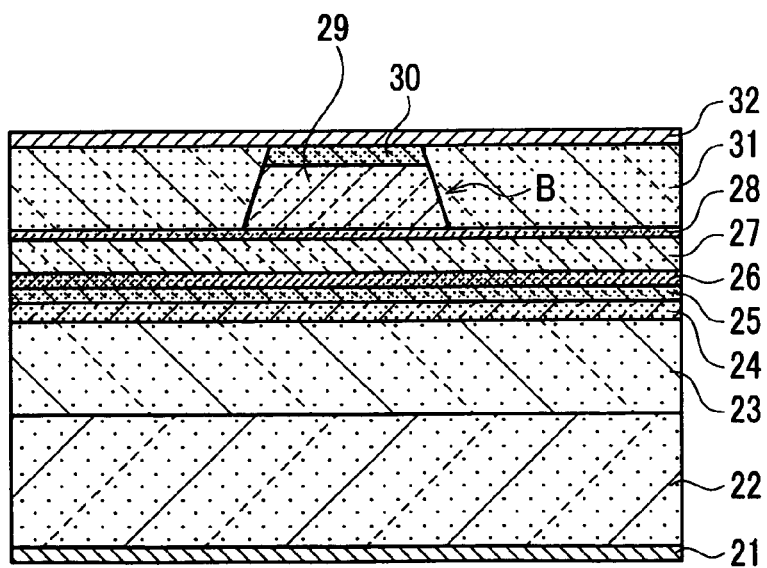
FIG. 5 is a drawing showing a cross-sectional structure of an AlInGaP based semiconductor element.

Next, FIG. 5 shows a specific structure of the red LD 2. The red LD 2 is formed of an AlInGaP based semiconductor. Moreover, crystal growth of each semiconductor layer is performed by known metal-organic vapor phase epitaxy (MOVPE). An n type AlGaInP clad layer 23, an AlGaInP light guide layer 24, an MQW active layer 25, an AlGaInP light guide layer 26, a p type AlGaInP first clad layer 27, an AlGaInP etching stop layer 28, an n type AlGaInP block layer 31, a p type AlGaAs second clad layer 29, a p type GaAs contact layer 30, and a p electrode 32 are layered on an inclined n type GaAs substrate 22. An n electrode 21 is formed on a rear side of the n type GaAs substrate 22. A substrate having the crystal orientation inclined by 10 to 15° with respect to (001) is used for the n type GaAs substrate 22.

The MQW active layer 25 is made of three GaInP well layers and two undoped $(Al_{0.5}Ga_{0.5})_{0.5}In_{0.5}P$ barrier layers. The n type AlGaInP clad layer 23 is made of $(Al_{0.7}Ga_{0.3})_{0.5}In_{0.5}P$ doped with an n type impurity Si. Each of the AlGaInP light guide layer 24 and the AlGaInP light guide layer 26 is made of undoped $(Al_{0.5}Ga_{0.5})_{0.5}In_{0.5}P$. The p type AlGaInP first clad layer 27 is made of $(Al_{0.7}Ga_{0.3})_{0.5}In_{0.5}P$ doped with a p type impurity Zn. The AlGaInP etching stop layer 28 is made of a layer obtained by using three layers of distortionless $(Al_{0.1}Ga_{0.9})_{0.5}In_{0.5}P$ doped with a p type impurity Zn, and two layers of $(Al_{0.4}Ga_{0.6})_{0.5}In_{0.5}P$ doped with the p type impurity Zn and stacking these layers alternately. The p type AlGaAs second clad layer 29 is made of $Al_{0.5}GaAs$ doped with a p type impurity Zn. The p type GaAs contact layer 30 is made of GaAs doped with a p type impurity Zn. The n type AlGaInP block layer 31 is made of $(Al_{0.8}Ga_{0.2})_{0.5}In_{0.5}P$ doped with an n type impurity Si. A multi-layered metal layer made of Ti and Au is used for the p electrode 32, and an alloy layer made of Au, Ge, and Ni, and a multi-layered metal layer made of Ti and Au are used for the n electrode 21.

The MQW active layer 25 is sandwiched between the AlGaInP light guide layers 24 and 26 on both sides of the MQW active layer 25. These light guide layers are formed to confine the light perpendicularly. A perpendicular divergence angle can be controlled in accordance with a composition and a thickness of the light guide layer. When this light confinement in a perpendicular direction is weakened, a light spot is expanded perpendicularly and the perpendicular divergence angle (size in a deposition direction of FFP) of an emitting beam is decreased.

The high outputting red semiconductor laser diode shown in FIG. 5 has a ridge portion B in a stripe shape formed of the p type AlGaAs second clad layer 29 and the p type GaAs contact layer 30, and has an embedded ridge structure in which both sides of this ridge portion B are covered with the n type AlGaInP block layer 31. A current flows through the ridge portion B in a stripe shape without flowing into the n type AlGaInP block layer 31 and the lower part thereof that are reverse biased.

In the example in which the green LD 1 and the red LD 2 are formed as described above, when the negative electrode of the green LD 1 and that of the red LD 2 are bonded to the metal wiring 4 on the supporting substrate 5, the n electrode 42 and the n electrode 21 are connected to the metal wiring 4 as mentioned above. On the other hand, when the positive electrodes are bonded to the metal wiring 4, the p electrode 41 and the p electrode 32 are connected to the metal wiring 4.

Since two of the green semiconductor laser diode and the red semiconductor laser diode in total are used, and disposed on a common supporting substrate as described above, the laser light emitting device can be greatly miniaturized. Moreover, while the green LD 1 is formed of a GaN-based semiconductor, the green LD 1 has a nonpolar plane or a semipolar plane as the plane for crystal growth, unlike the conventional c plane crystal growth. Accordingly, polarization in the quantum well layer can be suppressed, the light emitting efficiency can be increased, and the green wavelength can be oscillated. Furthermore, the problem of shift of the emission wavelength caused by change of the current or the like is eliminated so that a stable oscillation wavelength can be achieved.

Next, FIG. 2 shows a device emitting laser beams of not only red and green but also blue. The same reference numerals as those in FIG. 1 designate the same components. In addition to the configuration of FIG. 1, a blue LD 3 is connected to the metal wiring 4, and the lead wire 6 is wired from the blue LD 3 to a side opposite to the metal wiring 4. The blue LD 3 is formed so as to have an oscillation wavelength of 460 nm±20 nm (440 nm to 480 nm). As shown in FIG. 2, semiconductor laser diodes of three primary colors R, G, B are prepared and disposed on the supporting substrate 5, which is a common support body for these semiconductor laser diodes. Accordingly, the entire laser light emitting device can be greatly miniaturized.

On the other hand, although a specific structure of the blue LD 3 is not different from the structure of the semiconductor laser diode in FIG. 4 described as the structure of the green LD 1, the In composition ratio of the active layer 15 is different. Desirably, the In composition of the InGaN well layer of the active layer 15 is around 15%, and the InGaN well layer is around 30 Å. Moreover, in the case of the blue LD 3, the main surface for crystal growth may be the m plane for growth, but alternatively, the main surface for crystal growth may be the c plane since the blue LD 3 has the In composition in the active layer 15 lower than that of the green LD 1 and has a influence from a piezoelectric field smaller than that in the green LD 1.

FIG. 3 shows an entire structure in a case of packaging the laser light emitting device in which the respective semiconductor laser diodes of R, G, and B are disposed on the supporting substrate 5 as shown in FIG. 2 (metal wiring 4 is not shown). FIG. 3(a) shows a drawing observed from the front surface of the package, and FIG. 3(b) shows a drawing observed from the rear surface of the package.

The supporting substrate 5 having the semiconductor laser diodes of R, G, and B disposed thereon is attached to a metal supporting base 41, and the supporting base 41 is further attached to a metal stand 42. Three lead pins 43 are made of a metal, and are respectively connected with the lead wires 6, 7, and 8. The three lead pins 43 are connected to independent voltage driving terminals. The laser beam is emitted as shown in the drawing. Each lead pin 43 and the metal stand 42 are insulated by an insulator 50 so as not to be short-circuited. On the other hand, the lead wire 9 connected to the metal wiring 4 is electrically connected to a lead pin 44 through the supporting base 41 and the stand 42.

As mentioned above, since the semiconductor laser diodes are used for all of the light sources of R, G, and B, compact packaging is enabled. A diameter of the stand 42 can be formed in a size of approximately 5.6 mm, for example. The laser light emitting device packaged as shown in FIG. 3 is used as an RGB light source for color displays, for example.

Figure 6:
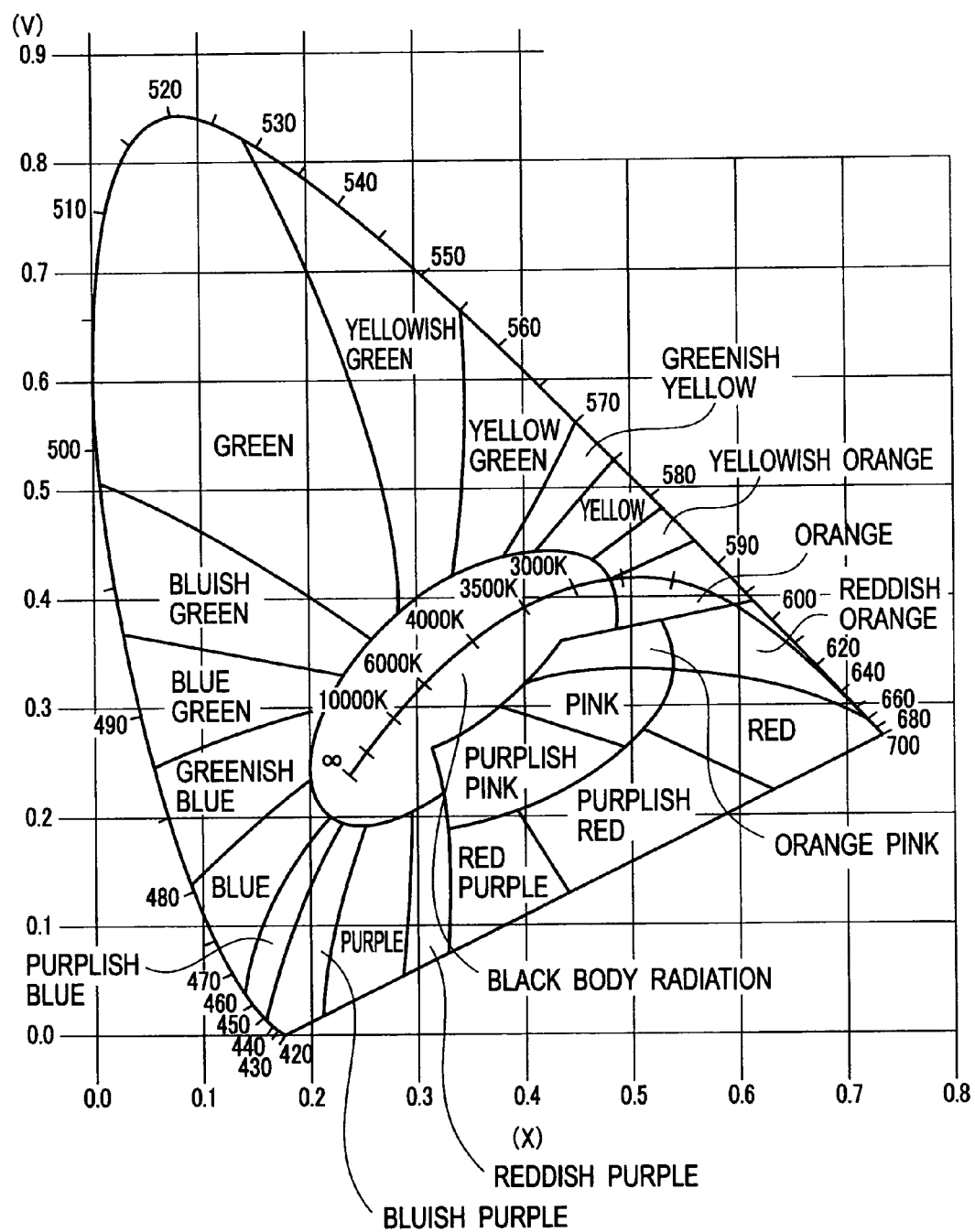
FIG. 6 is a drawing showing a CIE chromaticity diagram.

FIG. 6 shows a CIE chromaticity diagram. As mentioned above, the laser light emitting device according to the present invention has a center of the oscillation wavelength in the green LD 1 set to 532 nm, a center of the oscillation wavelength in the red LD 2 set to 645 nm, and a center of the oscillation wavelength in the blue LD 3 set to 460 nm. Accordingly, the laser light emitting device according to the present invention can cover the color range in the CIE chromaticity diagram widely.

Figure 7:
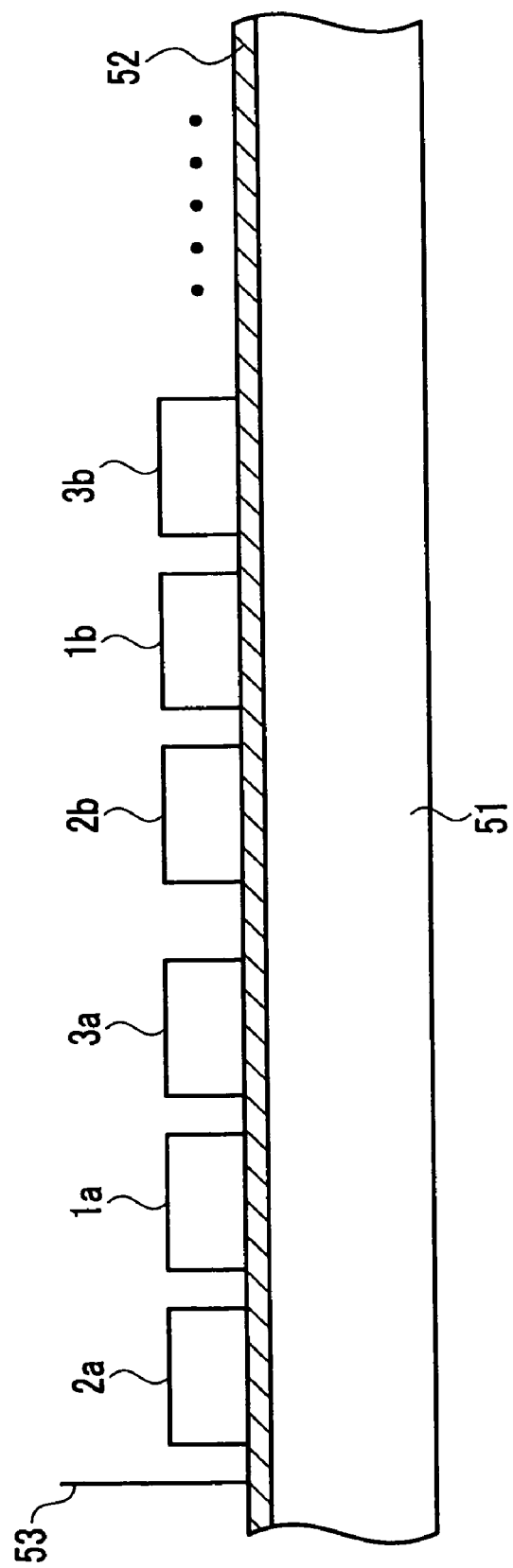
FIG. 7 is a drawing showing a structure of an array type laser light emitting device using a laser light emitting device according to the present invention.

Next, FIG. 7 shows an array type laser light emitting device in which a green LD, a red LD, and a blue LD are periodically arranged in an array. A metal wiring 52 is formed on a supporting substrate 51 as a support body. One set of the red LD, the green LD, and the blue LD are repeatedly disposed on the metal wiring 52 in a manner that first, a red LD 2a, a green LD 1a, and a blue LD 3a are disposed on the metal wiring 52, and then, a red LD 2b, a green LD 1b, and a blue LD 3b are disposed.

Here, either one of the positive electrodes and the negative electrodes in the red LDs 2a to 2n, the green LDs 2a to 2n, and the blue LDs 2a to 2n) are all short-circuited by the metal wiring 52. The metal wiring 52 is connected to a lead wire 53. On the other hand, the electrodes having a polarity opposite to the electrodes connected to the metal wiring 52 are connected to lead wires 6a, 6b, . . . , lead wired 7a, 7b, . . . , and lead wires 8a, 8b, . . . for each semiconductor laser diode. Voltages given to these lead wires are driven independently. Here, the LDs having the same oscillation wavelength may be driven in conjunction with each other, not driven independently.

As mentioned above, since the semiconductor laser diodes are used for all of the light sources of RGB, the entire device can be miniaturized also in the case of configuring the array type laser light emitting device. Note that the array type laser light emitting device may be configured by vertically arranging several supporting substrates 51 on which the semiconductor laser diodes are arranged in a line form as shown in FIG. 7, so as to dispose the semiconductor laser diodes two-dimensionally.

The invention claimed is:

1. A laser light emitting device comprising:
   a common support body;
   a common metal wiring disposed on the common support body;
   a GaN-based semiconductor laser diode having a first positive electrode and a first negative electrode and being disposed on the common metal wiring, one electrode of the first positive electrode and the first negative electrode being bonded to the common metal wiring and the other electrode of the first positive electrode and the first negative electrode being connected to a first lead wire, the GaN-based semiconductor laser diode having a nonpolar plane as a main surface for crystal growth;
   an AlInGaP-based semiconductor laser diode having a second positive electrode and a second negative electrode and disposed on the common metal wiring, one of the second positive electrode and the second negative electrode having a same electrical polarity as said one electrode being bonded to the common metal wiring to which said one electrode is bonded to, and the other of the second positive electrode and the second negative electrode being connected to a second lead wire; and
   a third lead wire connected to the common metal wiring for supplying a common electric potential to the GaN-based semiconductor laser diode and the AlInGaP-based semiconductor laser diode via the common metal wiring,
   wherein the first lead wire and the second lead wire are each connected to a respective different voltage terminal, the first lead wire and the second lead wire each having a driving voltage for emitting light being supplied thereto from the respective voltage terminal.

2. The laser light emitting device according to claim 1, wherein the GaN-based semiconductor laser diode has an oscillation wavelength of 512 nm to 552 nm so as to emit green light.

3. The laser light emitting device according to claim 1, wherein the AlInGaP-based semiconductor laser diode has an oscillation wavelength of 625 nm to 665 nm so as to emit red light.

4. The laser light emitting device according to claim 1, wherein the GaN-based semiconductor laser diode is formed of a first GaN-based semiconductor laser diode and a second GaN-based semiconductor laser diode.

5. The laser light emitting device according to claim 4, wherein the first GaN-based semiconductor laser diode has an oscillation wavelength of 440 nm to 480 nm so as to emit blue light, and the second GaN-based semiconductor laser diode has an oscillation wavelength of 512 nm to 552 nm so as to emit green light.

6. The laser light emitting device according to claim 1, wherein the support body is made of AlN.

7. The laser light emitting device according to claim 1, further comprising a plurality of GaN-based semiconductor laser diodes and a plurality of AlInGaP-based semiconductor laser diodes that are repeatedly arranged in an array.

8. The laser light emitting device according to claim 1, wherein the first negative electrode and the second negative electrode are both bonded to the common metal wiring.

9. The laser light emitting device according to claim 8, wherein the first negative electrode and the second negative electrode both touch the common metal wiring.

10. The laser light emitting device according to claim 1, wherein the first positive electrode and the second positive electrode are both bonded to the common metal wiring.

11. The laser light emitting device according to claim 10, wherein the first positive electrode and the second positive electrode both touch the common metal wiring.

12. The laser light emitting device according to claim 1, wherein the driving voltages are different from each other.

13. The laser light emitting device according to claim 1, wherein the driving voltage supplied to the first lead wire drives the GaN-based semiconductor laser diode, and the driving voltage supplied to the second lead wire drives the AlInGaP-based semiconductor laser diode.

* * * * *